United States Patent [19]
Ding et al.

[11] Patent Number: 5,566,078
[45] Date of Patent: Oct. 15, 1996

[54] INTEGRATED CIRCUIT CELL PLACEMENT USING OPTIMIZATION-DRIVEN CLUSTERING

[75] Inventors: Cheng-Liang Ding, San Jose; Ching-Yen Ho, Saratoga, both of Calif.

[73] Assignee: LSI Logic Corporation, Milpitas, Calif.

[21] Appl. No.: 68,013

[22] Filed: May 26, 1993

[51] Int. Cl.$^6$ ............................................. G06F 17/50
[52] U.S. Cl. ...................... 364/490; 364/489; 364/491
[58] Field of Search ........................... 364/490, 491, 364/488, 489; 257/208, 211

[56] References Cited

U.S. PATENT DOCUMENTS

| | | | |
|---|---|---|---|
| 4,495,559 | 1/1985 | Gelatt, J. et al. | 364/148 |
| 4,500,963 | 2/1985 | Smith et al. | 364/300 |
| 4,554,625 | 11/1985 | Otten | 364/148 |
| 4,593,363 | 6/1986 | Burstein et al. | 364/491 |
| 4,612,618 | 9/1986 | Pryor et al. | 364/490 |
| 4,630,219 | 12/1986 | DiGiacomo et al. | 364/488 |
| 4,688,072 | 8/1987 | Heath et al. | 357/45 |
| 4,890,238 | 12/1989 | Klein et al. | 364/491 |
| 4,908,772 | 3/1990 | Chi | 364/491 |
| 4,918,614 | 4/1990 | Modarres et al. | 364/490 |
| 5,202,840 | 4/1993 | Wong | 364/490 |
| 5,212,653 | 5/1993 | Tanaka | 364/491 |
| 5,218,551 | 6/1993 | Agrawal et al. | 364/491 |
| 5,222,031 | 6/1993 | Kaida | 364/491 |
| 5,237,514 | 8/1993 | Curtin | 364/490 |
| 5,267,176 | 11/1993 | Antreich et al. | 364/491 |
| 5,311,443 | 5/1994 | Crain et al. | 364/491 |
| 5,349,536 | 9/1994 | Ashtaputre et al. | 364/491 |
| 5,353,235 | 10/1994 | Do et al. | 364/491 |

FOREIGN PATENT DOCUMENTS

| | | | |
|---|---|---|---|
| 0133466A2 | 2/1985 | European Pat. Off. | 23/52 |
| WO90/053 | 5/1990 | WIPO | 15/60 |

OTHER PUBLICATIONS

Ding et al., "A New Optimization Driven Clustering Algorithm for Large Circuits," Oct. 26, 1992.
"A Linear-Time Heuristic for Improving Nerwork Partitions", by Fiduccia, Manuscript, Apr. 1982, 7 pages.
"Improvements of a Mincut Partition Algorithm", by Ng et al., CH2469-5/1987, IEEE, pp. 470–473.
"Clustering Based Simulated Annealing for Standard Cell Placement", by Mallela, 25th ACM/IEEE Design Automation Conference, 1988, pp. 312–317.
"Proud: A Fast Sea-Of-Gates Placement Algorithm", by Tsa et al., 25th ACM/IEEE Design Automation Conference, 1988, pp. 318–323.
"Finding Clusters in VLSI Circuits", by Garbers et al., IEEE, 1990, pp. 520–523.
"An Efficient Placement Method for Large Standard-Cell and Sea-Of-Gates Designs", by Kappen et al., IEEE, 1990, pp. 312–316.
"Gordian: VLSI Placement by Quadratic Programming and Slicing Optimization", by Kleinhans et al., IEEE Transactions on Computer-Aided Design, vol. 10, No. 3, Mar. 1991, pp. 356–365.

(List continued on next page.)

Primary Examiner—Kevin J. Teska
Assistant Examiner—Thai Phan
Attorney, Agent, or Firm—Carr, DeFilippo & Ferrell

[57] ABSTRACT

An integrated circuit layout technique is described which employs an optimization-driven clustering technique to provide improved cell placement. The technique utilizes clustering of cells based upon Rent's rule, with global-optimization-derived inter-cell distances being used to break ties when identical Rent exponents are encountered. A constraint on the number of cells permitted to be in a cluster and a constraint on the maximum Rent exponent which to be considered for merging clusters minimize the "overgrowth" of clusters and serve to even out cluster size, ideally suiting the technique to conventional partitioning and placement schemes.

10 Claims, 1 Drawing Sheet

"New Spectral Methods for Ration Cut Partitioning and Clustering", by Hagen et al., IEEE Transactions on Computer-Aided Design, vol. 11, No. 9, Sep. 1992, pp. 1074–1085.

"Net Partitions Yield Better Module Partitions", by Cong et al., 29th ACM/IEEE Design Automation Conference, 1992, pp. 47–52.

"Gordian: A New Global Optimization/Rectangle Dissection Method for Cell Placement", by Kleinhans et al., pp. 506–509.

INTEGRATED CIRCUIT CELL PLACEMENT USING OPTIMIZATION-DRIVEN CLUSTERING

TECHNICAL FIELD OF THE INVENTION

The invention relates to integrated circuit fabrication, more particularly to floorplanning of an integrated circuit, and still more particularly to cell placement as it relates to the floorplanning process.

BACKGROUND OF THE INVENTION

Essential to the fabrication of an integrated circuit based upon an integrated circuit design is the process of laying out component "cells" or circuit functions in the space available in an integrated circuit die. This process is also known as "floorplanning". Floorplanning is the process of placing functional devices (also referred to as: "cells", "functions", "modules", "elements", "blocks", or "functional blocks") on an integrated circuit die and allocating interconnection space between them, so as to minimize the actual die area required to encompass such cells and their interconnections, and to maximize the probability that such interconnections can be routed within that area.

Automated floorplanners are known in the art. An example of such a floorplanner is given in U.S. Pat. No. 4,918,614, "Hierarchical Floorplanner", issued Apr. 17, 1990 to Modarres (hereinafter "Modarres"), incorporated herein by reference.

Typically, an automated floorplanner will attempt to partition an integrated circuit die area into a number of smaller areas (sub-partitions) according to the relationships between cells in an integrated circuit design, and to assign those cells to those smaller areas in a fashion which will (hopefully) minimize the distance between cells which are highly connected (minimize wire routing problems) and which will minimize the total amount of die area required. Modarres described a technique whereby the partitioning and placement proceeds according to a design hierarchy, and is applied recursively to the design until the bottom level of the design is reached.

A commonly used partitioning technique is known as the "min-cut" algorithm, described in C. Fiduccia and R. Mattheyses, "A Linear-Time Heuristic for Improving Network Partitions," Proc. Design Automation Conference, 1982, p. 175, (hereinafter KLFM). One problem with the KLFM algorithm is that it is order-dependent, that is, the order in which cells are encountered by the algorithm affects the resultant partitioning.

A common approach to handling placement problems is to combine top-down and bottom-up techniques. The bottom-up approach is called "clustering", and involves grouping of the most highly connected cells in a design into "clusters" of cells. The goal of the top-down technique is to determine the locations for all of the clusters (placement). It is well known that "clustering" or grouping of related cells into "clusters" before cell placement can improve the quality of placement and reduce the run-time of an automated layout (floorplanning) system significantly. (The "clusters" are treated as "cells" for purposes of initial placement.)

Many approaches have been proposed for attacking the clustering problem. Known techniques in this area can be grouped into two major categories:

1) identification of clusters by naturally occurring relationships (e.g., connectivity) inherent in the integrated circuit design, and 2) use of local connectivity information to help identify clusters.

Examples of the first category of clustering approach (also known as "global optimization") are found in J. Garbers, H. J. Promel and A. Steger, "Finding Clusters in VLSI Circuits," Proc. Int. Conf. Computer-Aided-Design, 1990, pp. 520–523, (hereinafter "GPS90") and in L. Hagen and A. B. Kahng, "New Spectral Methods for Ratio-Cut Partitioning and Clustering," UCLA CS Dept., TR-019973, October 1991 (hereinafter "HK91").

Global optimization has been widely used to help cell placement. Examples of this are found in R. S. Tsay, E. S. Kuh, and C. P. Hsu, "PROUD: A Fast Sea-Of-Gates Placement Algorithm," proc. Design Automation Conference, 1988, pp. 318–323 (hereinafter "TKH88"), H. J. Kappen and F. M. J. deBont, "An Efficient Placement Method for Large Standard-Cell and Sea-of-Gates Designs," EDAC, 1990, pp. 312–316 (hereinafter "KdB90"), J. M. Klenhans, G. Sigl, F. M. Johannes and K. J. Antreich, "GORDIAN: VLSI Placement by Quadratic Programming and Slicing Optimization," IEEE Trans. on CAD, vol 10, no. 3, March, 1991, pp. 356–365 (hereinafter KSJA91), and J. Cong, L. Hagen and A. Kahng, "Net Partitions Yield Better Module Partitions," Proc. Design Automation Conference, 1992, pp. 47–52 (hereinafter "CHK92").

HK91 and CHK92 apply global optimization to partitions. In general, global optimization gives a global picture of the design, no matter whether the objective function of the global optimization is minimizing total wire length or finding the eigenvector of the second smallest eigenvalue.

GPS90 describes clustering based upon "k-connectedness" in graph theory. HK91 describes a technique whereby the value of an eigenvector corresponding to the second smallest eigenvalue is used to identify clusters. Although these global optimization techniques are relatively simple to implement, they have at least one major drawback in that clusters formed by this technique can vary greatly in size; a significant problem if those clusters are to be placed using conventional placement algorithms. Conventional placement algorithms approach placement by dividing areas (partitions) of a die into evenly sized sub-partitions. If cluster sizes are permitted to vary significantly, the "fit" of these clusters to the sub-partitions is considerably less than optimal, causing poor utilization of die area.

Examples of the second category of clustering approach are found in T. Ng, J. Oldfield, and V. Pitchumani, "Improvements of a Mincut Partition Algorithm," Proc. Int. Conf. Computer-Aided Design, 1987, pp. 470–473, (hereinafter NOP87) and in S. Mallela and L. K. Grover, "Clustering based Simulated Annealing for Standard Cell Placement," Proc. Design Automation Conference, 1988, pp. 312–317 (hereinafter MG88). Both NOP87 and MG88 describe identification of clusters by using local connectivity information. However, since local connectivity information is missing or hidden in very large designs, the performance of these techniques degrades as the designs to which they are applied become larger, again causing poor utilization of die area.

DISCLOSURE OF THE INVENTION

It is therefore an object of the present invention to provide a technique for laying out cells of an integrated circuit design which provides better utilization of die area.

It is a further object of the present invention to provide a technique for laying out cells of an integrated circuit design which provides better placement performance with respect to routing of inter-cell connections.

It is a further object of the present invention to provide a cell clustering technique which prevents the formation of excessively large clusters.

It is a further object of the present invention to provide a cell clustering technique which performs well for very large integrated circuit designs.

It is a further object of the present invention to provide improved performance of layout method with respect to die area utilization and routing simplicity for very large integrated circuit designs.

According to the invention, a hybrid clustering technique is used which is divided into steps: a global optimization process and clustering based upon Rent's Rule (described hereinbelow). The objective of the global optimization step is to minimize the total wire length. This problem is formulated as a linearly constrained quadratic programming problem (LQP). Although the result of this optimization does not necessarily yield a valid placement (cells are likely to overlap within the die area), the distance between cells can be (is) used as an index of global connectivity. After determining the global connectivity information, Rent's rule is used to do clustering. When the circuit is large, there can be many pairs of clusters which end up with the same Rent exponent. The order of merging these pairs can have a dramatic effect on the results of clustering. The global connectivity information collected from the first step (global optimization) determines which pairs should be merged first.

The inventive technique comprises globally optimizing a placement of the cells within a layout area (or core area) of an integrated circuit die area by determining a placement of cells based upon an objective function, defining each cell as a single-cell cluster, identifying neighboring clusters according to the placement, grouping pairs of neighboring clusters into larger multi-cell clusters, and completing a layout process based upon the integrated circuit design, the integrated circuit die size and shape, and die area partitioning and placement of the clusters of cells.

The grouping of cells into larger clusters is accomplished by selecting a pair of neighboring clusters which, if merged, would form a larger cluster with a relatively high degree of internal connectivity and a relatively low degree of external connectivity according to a figure-of-merit for the larger clusters, selecting from multiple pairs of clusters which have the same figure-of-merit only that pair of clusters which has the least inter-cluster distance, and merging the selected pair of neighboring clusters into a larger multi-cell cluster and eliminating the pair of neighboring clusters, if the larger cluster has a total number of included cells which is less than a first pre-defined constraint. This process of grouping cells (and clusters) into larger clusters is repeated until a termination condition is met.

According to one feature of the invention, the figure-of-merit for each larger cluster is determined according to:

$$r \approx 1 + \frac{\ln(E/T)}{\ln(B)}$$

where r is the figure-of-merit, E is the number of connections between cells within the larger cluster and cells outside of the larger cluster, B is the total number of cells within the larger cluster, and T is the total number of connection points on cells included within the larger cluster.

According to another feature of the invention, the selection of a pair of neighboring cells according to the figure-of-merit is accomplished by selecting the pair of neighboring cells having the lowest figure-of-merit value for the larger cluster to be formed therefrom.

According to another feature of the invention, the distance between each neighboring pair of clusters $C_i$ and $C_j$ is determined according to the equation:

$$\text{dist}(C_i, C_j) = \max\{\text{dist}(c_k, c_l)|_{\forall (c_k \in C_i, c_l \in C_j)}\}$$

where $c_k$ is a cell k within cluster $C_i$, $c_l$ is a cell l within cluster $C_j$, and $\text{dist}(c_k, c_l)$ is the distance from cell $c_k$ to cell $c_1$.

According to another feature of the invention, the termination condition is met when either of two conditions is met. The first of the two conditions is that there are no remaining entries in the "pair" list. The second of the two conditions is that the figures-of merit associated with all of the remaining entries in the "pair" list are outside of a pre-defined range of values.

According to the invention, the inventive technique is accomplished according to a series of steps as follows:

a) providing an integrated circuit die size and shape;

b) defining within the integrated circuit die size and shape a layout area;

c) providing an integrated circuit design including a plurality of cells and a plurality of inter-cell connections; said cells each having one or more connection points by which the inter-cell connections are accomplished;

d) performing a global optimization process to arrive at an optimal placement of the cells within the layout area, and store coordinates of each cell in a "cluster" list, according to the placement;

e) defining each cell in the "cluster" list as a "cluster";

f) identifying pairs of neighboring clusters according to the placement, computing a figure-of-merit for each pair of neighboring clusters, and storing an identifier and the computed figure-of-merit for each pair of neighboring clusters in a "pair" list;

g) sorting the "pair" list according to the figure-of-merit;

h) selecting and removing the "pair" list entry for a neighboring pair of clusters having a best figure-of-merit according to a pre-defined criterion, unless there is a "tie" where two or more entries in the "pair" list have equal (best) figures-of-merit, in that case breaking the tie by selecting and removing from the "pair" list the entry corresponding to a neighboring pair of clusters having the best figure-of-merit and having the least distance ("tie-breaker") between the clusters;

i) proceeding to step "m" if the figure-of-merit for the selected neighboring pair of clusters fails to meets a pre-determined first constraint, otherwise proceeding to step "j";

j) proceeding to step "l" if the total number of cells within the neighboring pair of clusters fails to meet a pre-defined second constraint, otherwise proceeding to step "k";

k) forming a new cluster by merging the selected neighboring pair of clusters into a single cluster, updating the "cluster" list to include the new cluster and a set of coordinates for the new cluster, computing new figures-of-merit for new entries in the "pair" list which includes neighboring pairs of clusters which include the new cluster, eliminating entries in the "pair" list corresponding to any neighboring pair of cluster which includes either of the clusters in the selected neighboring pair, and re-sorting the pair list according to the figure of merit;

l) proceeding to step "h" if there are any remaining entries in the "pair" list, otherwise proceeding to step m;

m) completing a layout process based upon the integrated circuit design, the integrated circuit die size and shape, and die area partitioning and placement of the clusters of cells, said layout process resulting in an integrated circuit layout.

According to one feature of the invention with respect to this embodiment, the first pre-determined constraint is that the figure-of-merit is below a pre-determined value.

According to another feature of the invention with respect to this embodiment, the second pre-determined constraint is that the total number of cells within a cluster may not exceed a pre-determined number.

By using global connectivity information to choose which of a group of pairs of clusters is to be merged first, the order of the cluster list is such that the "best" clusters are presented first. When applied to a conventional partitioning and placement technique (e.g., KLFM), the resulting layout is more efficient and predictable.

The two constraints, i.e., limiting the figure-of-merit (actually a Rent exponent) and limiting the number of cells which may be included in a cluster, cluster size is limited and cluster "quality" (as based on figure-of-merit) is improved, yielding better overall performance of the ensuing layout process.

Other objects, features and advantages of the invention will become apparent in light of the following description thereof.

DETAILED DESCRIPTION OF THE INVENTION

Figure 1:
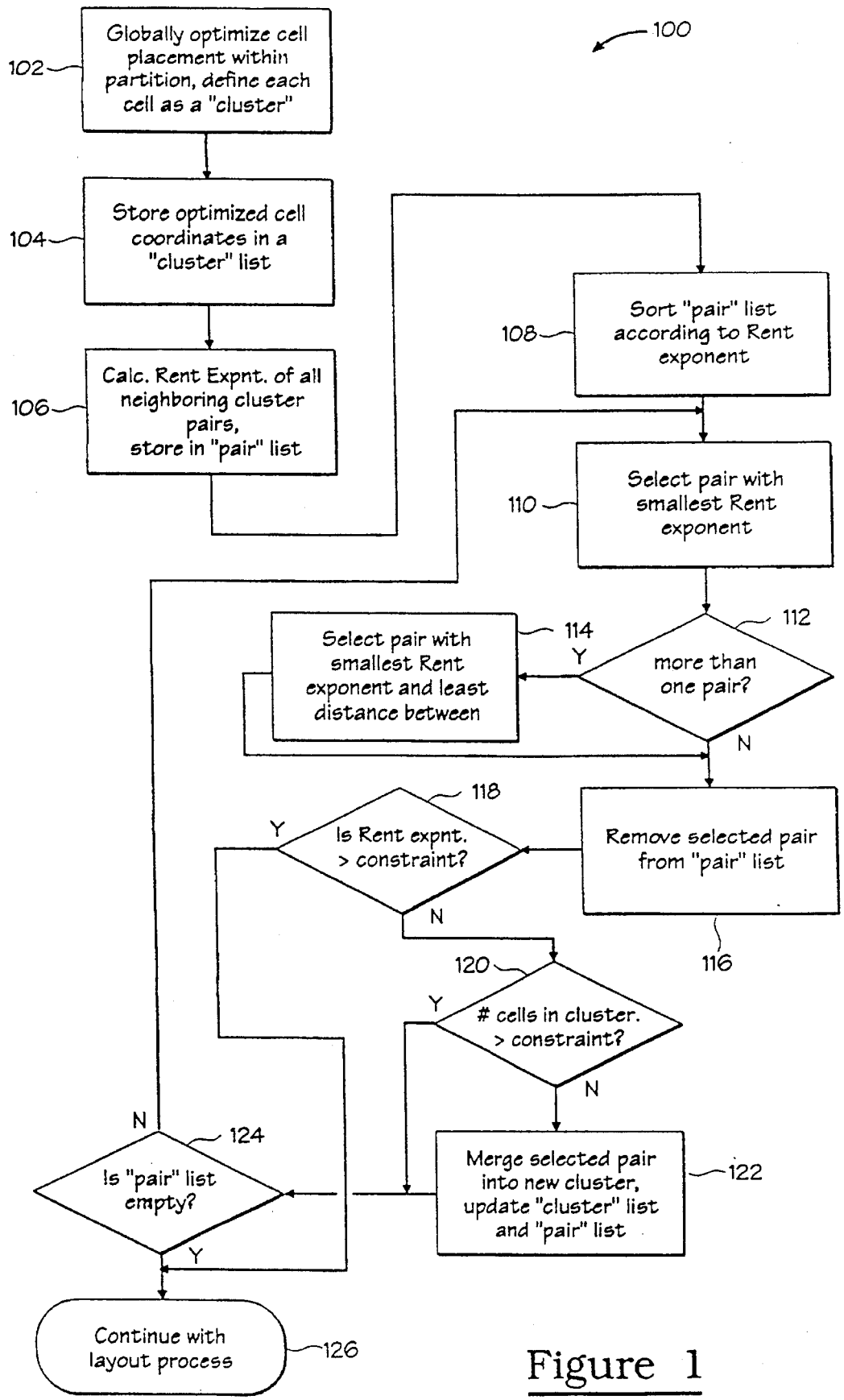
FIG. 1 is a flowchart which describes a method according to the present invention.

The present inventive technique provides a performance improvement over prior art placement techniques which is especially well suited to very large designs. This is accomplished by performing an initial global optimization, followed by clustering of cells based upon Rent's rule. Distances between cells determined during global optimization are used as "tic-breakers" when there are multiple clustering choices based upon Rent's rule. Constraints are placed upon the number of cells which are bound together in a cluster, and upon the "Rent exponent" which is used to cluster them. These two constraints ensure that only highly-related cells are clustered together and that clusters cannot turn into oversized "giants" which frustrate the placement process. The results of this compound clustering technique then feeds into normal partitioning. By providing highly optimal selection and ordering of clusters, the results of the ensuing placement process (which is sensitive to ordering and to selection of clusters) are improved.

Inasmuch as the present inventive technique is used in conjunction with global optimization and clustering, the discussion hereinbelow provides descriptions of representative global optimization and clustering techniques.

GLOBAL OPTIMIZATION

Global optimization is a technique which determines locations for (places) cells in an optimal, although not necessarily valid, location based solely upon wire length (or, as in HK91, upon finding the eigenvector of the second smallest eigenvalue). The placement is such that the total of all wiring distances between connected "pins" (connection points) of cells (or, as in HK91, another objective having a similar effect) is minimized. The reason that this placement is not necessarily valid is that the global optimization process simply places the "center of gravity" or "mass center" of cells into an optimal initial position, and does not take into account the physical sizes and shapes of the cells, yielding cell placements which may overlap. The positional relationships between cells may then be used to identify highly-connected or closely related candidate cells for merging into clusters.

Evidently, the cells cannot physically overlap on the integrated circuit. The layout process simply uses the positions of the cells resulting from global optimization as an initial placement to be used as the basis of determining "neighboring" relationships between cells for later clustering. Further layout processing yields valid placements based on information gleaned from the initial placements.

According to the invention, a suitable global optimization process, such as that described in HK91, is used which preferably "fixes" the locations of certain critical cells (e.g., I/O pads) at locations which are conducive to an optimal placement of the remaining ("free" or "movable") cells. These fixed placements of critical cells help to constrain the placement process by not only by fixing the position ("anchoring") of the critical cells, but by limiting the freedom of placement of cells which are connected to the "anchored" cells. As in any multi-dimensional process, limiting the number of degrees of freedom simplifies the problem and can dramatically reduce calculation time. The global optimization technique described in KSJA91 operates in this fashion, and is used as the basis of the discussion hereinbelow with respect to global optimization.

The global optimization process operates by attempting to minimize the value of an "objective function." The objective function of the global optimization process is related to the total wire length of an integrated circuit design. The unit of the wire length is the square of the euclidean distance. Each net is modelled as a "clique", and it is assumed that the final routing is a spanning tree connection. For example, if a net has "p" pins, and the weight of the net is "w", then the number of edges under global optimization is equal to:

$$\frac{p(p-1)}{2}$$

and the weight of each edge is equal to:

$$\frac{2w}{p}$$

Based on this formulation, the total wire length $L_i$ of net i is:

$$L_i = w_i \Sigma((x_v + \xi_{iv} - x_u - \xi_{iu})^2 + (y_v + \eta_{iv} - y_u - \eta_{iu})^2)$$

where $\xi_{iv}$ and $\eta_{iv}$ are the x and y coordinates, respectively of a pin connected to a net "i" relative to the center coordinates $(x_v, y_v)$ of a module "v" in which the pin is located. Similarly, $\xi_{iu}$ and $\eta_{iu}$ are the x and y coordinates, respectively of a pin connected to a net "i" relative to the center coordinates $(x_u, y_u)$ of a module "u" in which the pin is located.

The total wire length $\Phi$ of the design can be written in matrix form as:

$$\Phi(x,y) = x^T C x + 2 d_x^T x + y^T C y + 2 d_y^T y$$

The vectors x and y denote the coordinates of all movable modules (cells). The matrix C is positive definite if all movable modules are connected to fixed modules either directly or indirectly. Since $\Phi(x,y)$ is separable, it can be expressed as follows:

$$\Phi(x,y) = \phi(x) + \phi(y)$$

Directing attention to the part of the objective function which depends on x coordinates results in the following:

$$\phi(x) = x^T C x + 2 d^T x$$

where $d = d_x$.

The constraint of $\phi(x)$ puts the center of gravity at the center of the core region (placement region considered by the global optimization process). Let the x-coordinate of the center of the core region be $u_x$, then the constraint can be written in matrix form:

$$A x = u_x$$

where the matrix A captures the size ratio of all movable modules. Finally, the linearly constrained quadratic programing problem (LQP) can be written as:

$$LQP: \min \{\phi(x) = x^T C x + 2 d^T x |_{Ax=u_x}\}$$

Since $\phi(x)$ is a convex function (C is positive definite), the solution of the LQP has a unique global minimum. This problem can be solved very efficiently by doing pre-conditioning on the conjugate gradient method.

Clustering Based on Rent's Rule

In NOP87, a clustering technique based on Rent's rule is described. Rent's rule is actually an empirical formula which describes the general property of a design with moderate size. Rent's rule is expressed as follows:

$$E = \bar{p} \times B^r$$

where r is the Rent exponent, E is the number of external pins of a cluster, $\bar{p}$ is the average number of pins per cell, and B is the number of cells in the cluster.

Letting $\bar{T}$ be the average number of pins in a cluster, and manipulating E and $\bar{T}$, the following equation results:

$$r = 1 + \frac{\ln(E/\bar{T})}{\ln(B)}$$

or $$r \approx 1 + \frac{\ln(E/T)}{\ln(B)}$$

where T (no overbar) is the total number of pins in a cluster. By using the total number of pins in a cluster, rather than the average, a "greedy" approximation of the Rent's exponent results. The Rent exponent (r) is, in effect, a figure-of-merit for clusters which is lowest for clusters having large numbers of cells and a small number of external "pins" relative to the total number of "pins" on the cells within the cluster. A low Rent exponent implies that the cluster has a relatively high degree of internal connectivity and a relatively low degree of external connectivity, indicating a good clustering choice.

According to the invention, the projected Rent exponent is computed for every pair of neighboring clusters (based upon a projected merging of the pair). Each neighboring pair of clusters is a candidate for a merge into a single cluster. The smaller the rent exponent, the more desirable it is to merge the pair of clusters.

With this approach, larger clusters tend to grow even larger, because they have more pins, i.e., they have more common signals with other clusters. In response to this, the present inventive technique imposes two constraints to prevent the excessive growth of any cluster. This first constraint places an upper bound on the number of cells in a cluster. The second constraint places an upper bound on the Rent exponent of any proposed merged block. This second constraint prevents loosely coupled (not very heavily interconnected) clusters from merging together to form a large cluster.

When a clustering technique based upon the Rent exponent with constraints, as described hereinabove, is used, the results are comparable to those obtained from KLFM alone. However, for large designs, many cluster pairs may have the same Rent exponent. The order of merging of clusters has a dramatic effect on the quality of the final layout. According to the invention, a technique which provides a means for picking the "best" cluster pair for merging when multiple cluster pairs have the same Rent exponent is described hereinbelow.

Global Connectivity as Tie-Breaker

The problem with the aforementioned clustering algorithm is similar to the problem encountered in the KLFM algorithm, i.e., the quality of either algorithm is order dependent. The ordering problem in the KLFM algorithm is that there are a lot of cells with the same "gain", and the order of moving those cells can make the partitioning results vary considerably. The technique described in NOP87 used the clustering approach to stabilize the result of the KLFM algorithm because clustering makes the number of cells with the same gain number smaller. In KSJA91, global optimization is used to help the KLFM algorithm, since global optimization provides a better initial partition, and the resulting fixed cell placements limit the number of degrees of freedom in the placement problem. In the present invention, global optimization is further used to help clustering, because the clustering result will reflect the geometric relationships provided by global optimization, thereby providing better cluster merging.

The distance between a pair of clusters is given by a distance function as follows:

$$\text{dist}(C_i, C_j) = \max\{\text{dist}(c_k, c_l) |_{\forall (c_k \in C_i, c_l \in C_j)}\}$$

where:
$C_i$ denotes cluster i, $C_j$ denotes cluster j, $c_k$ denotes cluster k, $c_l$ denotes cluster l, and dist(a,b) is the distance from a to b.

It should be noted that the distance between two clusters is therefore the distance between the two component cells of those clusters which are the furthest apart.

The inventive technique can be summarized by the following steps:

Step 1. Perform global optimization (including "fixing" of critical cells and I/O block placement) and store the coordinates of each cell in a "cluster" list.

Step 2. Define each cell in the "cluster" list as a "cluster".

Step 3. Compute the Rent exponent of all neighboring cluster pairs and store in a "pair" list.

Step 4. Sort "pair" list by Rent exponent.

Step 5. Select and remove (delete) the pair (of clusters) with the lowest Rent exponent from the "pair" list. If there is a group of pairs (more than one pair) with the lowest Rent exponent in the "pair" list, from that group, select and remove (delete) the pair with the least distance between the pair.

Step 6. If the Rent exponent of the selected pair is greater than a pre-determined maximum Rent exponent, go to step 10.

Step 7. If the total number of cells contained in the pair of clusters is greater than a pre-determined maximum number of cells per cluster, go to step 9

Step 8. Form a new composite cluster by merging the pair, updating the "cluster" list, and computing new Rent exponents for a new "pair" list which includes pairs based on the newly merged cluster.

Step 9. If there are any pairs in the "pair" list, continue at step 4.

Step 10. Continue with layout processing.

FIG. 1 is a flow-chart diagram of a hybrid clustering process 100, according to the present invention. The steps in the process correspond roughly to steps 1–10 above, but are presented and explained in greater detail hereinbelow. In a first step 102, a global optimization process is performed on an integrated circuit design whereby cell placement is "optimized" according to an objective function within an area of an integrated circuit die. This area may be the total area of the die or a portion thereof. Initially, each cell is treated as a one-member cluster.

In a second step 104, the optimized coordinates of all of the cells resulting from the first step 102 are stored in a "cluster" list. Each entry in the cluster list identifies a cluster containing one or more cells, the optimized coordinates of the cluster, and the optimized coordinates of the cells. (The first step 102 and second step 104 correspond, in combination, roughly to steps 1 and 2 above).

In a third step 106, the Rent exponent of all neighboring pairs of clusters is calculated (effectively the result of a "trial" merge of the two clusters) and stored in a "pair" list. The Rent exponent is calculated according to the approximation:

$$r \approx 1 + \frac{\ln(E/T)}{\ln(B)}$$

where r is the Rent exponent, E is the number of external pins of a cluster, B is the number of cells, and T (no overbar) is the total number of pins. (The third step 106 corresponds to step 3 above)

Each entry in the "pair" list identifies a pair of clusters and the calculated Rent exponent for the pair.

In a fourth step 108, the "pair" list is sorted according to the Rent exponent associated with each entry. (The fourth step 108 corresponds to step 4 above.) This facilitates a fifth step 110, wherein the "pair" list entry with the smallest Rent exponent is selected. If a sixth step 112 determines that the smallest value of Rent exponent in the "pair" list is shared by more than one entry, then a seventh step 114, selects from those entries the entry with the smallest distance between the pair of clusters, as determined by:

$$\text{dist}(C_i, C_j) = \max\{\text{dist}(c_k, c_l)|_{\forall (c_k \in C_i, c_l \in C_j)}\}$$

where:
$C_i$ denotes cluster i, $C_j$ denotes cluster j, $c_k$ denotes cluster k, $c_l$ denotes cluster l, and dist(a,b) is the distance from a to b.

In an eighth step 116, the selected pair entry is removed from the "pair" list.

(The combination of the fifth, sixth, seventh, and eighth steps 110, 112, 114, and 116, respectively, corresponds to step 5 above.)

If a ninth step 118 determines that the Rent exponent associated with the selected entry is above a first pre-determined constraint, the clustering process is completed and the process proceeds to a final step 126 wherein the normal layout process (e.g., beginning with KLFM) resumes. If this is the case, then all remaining entries in the "pair" list have Rent exponents which are above the constraint, none of them are candidates for further clustering, and the "cluster" list contains the candidates for placement. (The ninth step 118 corresponds to step 6 above)

If the ninth step 118 determines that the Rent exponent for the selected cluster pair is less than or equal to the first pre-determined constraint, then a tenth step 120 determines whether or not the total number of cells in the cluster pair (to be merged into a cluster) is greater than a second pre-determined constraint. (The tenth step 120 corresponds to step 7 above) If not, an eleventh step 122 merges the selected pair into a new cluster, updates the "cluster" list (i.e., defines a new cluster including the selected pair, then removes the two entries associated with the selected pair, etc.), re-calculates Rent exponents for new cluster pairings with the newly merged cluster, updates the "pair" list to include the new pairings with the newly merged cluster and to remove pairings based upon the two merged clusters (which no longer exist independently of one another), and re-sorts the "pair" list. If the tenth step 120 determines that the number of cells in the merged cluster would be greater than the second pre-determined constraint, then the eleventh step 122 is skipped and the pair of clusters is not merged. Since the entry corresponding to that pair has already been removed from the "pair" list, the pair will not be re-considered for merging. (The eleventh step 122 corresponds to step 8 above).

A twelfth step 124 determines whether or not all entries have been removed from the "pair" list (i.e., if the pair list is empty, then all possible cluster pairings have been considered and either acted upon or discarded), and if so the clustering process is complete and processing resumes in a final step 126 wherein normal layout processing (e.g., beginning with KLFM) continues. IF there are entries remaining in the "pair" list, then the process resumes at the fifth step 110. (The twelfth step 124 corresponds to step 9 above).

The termination condition for the present inventive technique for forming clusters of cells, then, is that either all neighboring pairs in the "pair" list have been processed (as determined in the twelfth step 124) or that the Rent exponent (figure-of-merit) for the remaining pairs in the "pair" list is greater than the first pre-determined constraint (as determined in the tenth step 120).

It is within the scope of the present invention to apply this clustering technique iteratively. That is, as clusters are assigned to sub-partitions in a partitioning and placement process, the clustering technique of the present invention may be re-applied to the cells (associated with the clusters) assigned to the sub-partitions.

Further, any global optimization technique which comes up with an initial placement of cells based upon minimization (or maximization) of an objective functions may be employed. The technique described in KSJA91 is merely exemplary of such techniques. Other techniques are described in GPS90 and HK91.

What is claimed is:

1. A method of making, including layout functions for, an integrated circuit, comprising:

providing an integrated circuit design, said design including a plurality of cells and a plurality of interconnections between the cells, each cell having a one or more connection points;

providing an integrated circuit die size and shape and defining within the die size and shape a layout area;

globally optimizing a placement of all of the cells within the layout area based upon an objective function, wherein said step of optimizing assigns a location to each cell within the layout area and yields inter-cell physical distances for each pair of cells;

defining each cell as a single-cell cluster;

identifying neighboring clusters according to the placement;

grouping pairs of neighboring clusters into larger multi-cell clusters having internal connections, external connections and a total number of included cells, by:

selecting a pair of neighboring clusters which, if merged, would form a larger cluster with a relatively high degree of internal connectivity and a relatively low degree of external connectivity according to a single figure-of-merit for the larger clusters, selecting from multiple pairs of clusters which have the same figure-of-merit only that pair of clusters which has a least inter-cluster physical distance, whereby said least inter-cluster physical distance serves as a tie-breaker for selecting between the multiple pairs of clusters having the same figure of merit, and merging the selected pair of neighboring clusters into a larger multi-cell cluster and eliminating the pair of neighboring clusters, if the larger cluster has a total number of included cells which is less than a pre-defined number;

repeatedly grouping pairs of clusters into larger clusters until a termination condition is met;

completing a layout process based upon the integrated circuit design, the integrated circuit die size and shape, and die area partitioning and placement of the clusters of cells, said layout process resulting in an integrated circuit layout.

2. A method of making, including layout functions for, an integrated circuit, according to claim 1, wherein the figure-of-merit for each larger cluster is determined according to:

$$r \approx 1 + \frac{\ln(E/T)}{\ln(B)}$$

where r is the figure-of-merit, E is the number of connections between cells within the larger cluster and cells outside of the larger cluster, B is the total number of cells within the larger cluster, and T is the total number of connection points on cells included within the larger cluster.

3. A method of making, including layout functions for, an integrated circuit, according to claim 2, wherein:

the selection of a pair of neighboring cells according to the figure-of-merit is accomplished by selecting the pair of neighboring cells having the lowest figure-of-merit value for the larger cluster to be formed therefrom.

4. A method of making, including layout functions for, an integrated circuit according to claim 1, wherein:

the distance between each neighboring pair of clusters $C_i$ and $C_j$ is determined according to the equation:

$$\text{dist}(C_i, C_j) = \max\{\text{dist}(c_k, c_l)|_{\forall(c_k \in C_i, c_l \in C_j)}\}$$

where:

$c_k$ is a cell k within cluster $C_i$, $c_l$ is a cell l within cluster $C_j$, and $\text{dist}(c_k, c_l)$ is the distance from cell $c_k$ to cell $c_l$.

5. A method of making, including layout functions for, an integrated circuit according to claim 1, further comprising the step of forming a pair list of neighboring clusters containing the figure-of-merit for each of the neighboring clusters, wherein:

the termination condition is met when either of two conditions, designated "first condition" and "second condition," is met;

the first condition being that there are no remaining entries in the pair list; and the second condition being that the figures-of-merit associated with all of the remaining entries in the pair list are outside of a pre-defined range of values.

6. A method of making, including layout functions for, an integrated circuit, comprising the steps of:

a) providing an integrated circuit die size and shape;

b) defining with the integrated circuit die size and shape a layout area;

c) providing an integrated circuit design including a plurality of cells, and a plurality of inter-cell connections, said cells each having one or more connection points by which the inter-cell connections are accomplished;

d) performing a global optimization process to arrive at an optimal placement of all of the cells within the layout area based upon an objective function, wherein said optimization assigns a location to each cell within the layout area, and storing location coordinates of each cell in a cluster list, according to the placement;

e) defining each cell in the cluster list as a cluster;

f) identifying pairs of neighboring clusters according to the placement, computing a single figure-of-merit for each pair of neighboring clusters, and storing an identifier and the computed figure-of-merit for each pair of neighboring clusters in a pair list;

g) sorting the pair list according to the figure-of-merit;

h) selecting and removing the pair list entry for a neighboring pair of clusters having a best figure-of-merit according to a pre-defined criterion, unless there is a "tie" where two or more entries in the pair list have equal best figures-of-merit, in that case selecting and removing from the pair list the entry corresponding to the neighboring pair of clusters having the best figure-of-merit and having the least physical distance between the clusters, whereby the least physical distance between clusters serves as a tie-breaker for selecting between the entries in the pair list having the equal best figures-of-merit;

i) proceeding to step "m" if the figure-of-merit for the selected neighboring pair of clusters fails to meet a pre-determined first constraint, otherwise proceeding to step "j";

j) proceeding to step "l" if the total number of cells within the neighboring pair of clusters fails to meet a pre-defined second constraint, otherwise proceeding to step "k";

k) forming a new cluster by merging the selected neighboring pair of clusters into a single cluster, updating the cluster list to include the new cluster and a set of coordinates for the new cluster, computing new figures-of-merit for new entries in the pair list which includes neighboring pairs of clusters which include the new cluster, eliminating entries in the pair list corresponding to any neighboring pair of clusters which includes either of the clusters in the selected neighboring pair, and re-sorting the pair list according to the figure of merit;

l) proceeding to step "h" if there are any remaining entries in the pair list, otherwise proceeding to step "m";

m) completing a layout process based upon the integrated circuit design, the integrated circuit die size and shape, and die area partitioning and placement of the clusters of cells, said layout process resulting in an integrated circuit layout.

7. A method of making, including layout functions for, an integrated circuit, according to claim 6, wherein the figure-of-merit for each pair of neighboring clusters is determined according to:

$$r \approx 1 + \frac{\ln(E/T)}{\ln(B)}$$

where r is the figure-of-merit, E is the number of connections between cells within the pair of neighboring clusters and cells outside of the larger cluster, B is the total number of cells within the pair of neighboring clusters, and T is the total number of connection points on cells included within the pair of neighboring clusters.

8. A method of making, including layout functions for, an integrated circuit, according to claim 7, wherein:

the first pre-determined constraint is that the figure-of-merit is below a pre-determined value.

9. A method of making, including layout functions for, an integrated circuit according to claim 6, wherein:

the second pre-determined constraint is that the total number of cells within a cluster may not exceed a pre-determined number.

10. A method of making, including layout functions for, an integrated circuit according to claim 6, wherein:

the distance between each neighboring pair of clusters $C_i$ and $C_j$ is determined according to the equation:

$$\text{dist}(C_i, C_j) = \max\{\text{dist}(c_k, c_l)|_{\forall (c_k \in C_i, c_l \in C_j)}\}$$

where:

$c_k$ is a cell k within cluster $C_i$, $c_l$ is a cell l within cluster $C_j$, and $\text{dist}(c_k, c_l)$ is the distance from cell $c_k$ to cell $c_l$.

* * * * *